United States Patent
Prunnila et al.

(12)

(10) Patent No.: US 10,811,585 B2
(45) Date of Patent: Oct. 20, 2020

(54) THERMOELECTRIC DEVICE

(71) Applicant: TEKNOLOGIAN TUTKIMUSKESKUS VTT OY, Espoo (FI)

(72) Inventors: Mika Prunnila, VTT (FI); Jouni Ahopelto, VTT (FI); Andrey Timofeev, VTT (FI); Kestutis Grigoras, VTT (FI); Andrey Shchepetov, VTT (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/082,610

(22) PCT Filed: Mar. 3, 2017

(86) PCT No.: PCT/FI2017/050142
§ 371 (c)(1),
(2) Date: Sep. 6, 2018

(87) PCT Pub. No.: WO2017/153633
PCT Pub. Date: Sep. 14, 2017

(65) Prior Publication Data
US 2019/0013455 A1  Jan. 10, 2019

(30) Foreign Application Priority Data
Mar. 7, 2016  (FI) ..................................... 20165190

(51) Int. Cl.
*H01L 35/32* (2006.01)
*H01L 35/22* (2006.01)
(Continued)

(52) U.S. Cl.
CPC .............. *H01L 35/32* (2013.01); *G01J 5/061* (2013.01); *G01J 5/0809* (2013.01); *G01J 5/12* (2013.01); *G01J 5/14* (2013.01); *H01L 35/22* (2013.01)

(58) Field of Classification Search
CPC .......... H01L 35/32; H01L 35/22; G01J 5/061; G01J 5/0809; G01J 5/12; G01J 5/14
See application file for complete search history.

(56) References Cited

U.S. PATENT DOCUMENTS

| 5,714,791 A | 2/1998 | Chi et al. |
| 2009/0020148 A1* | 1/2009 | Boukai .................. H01L 35/26 136/201 |

(Continued)

FOREIGN PATENT DOCUMENTS

| EP | 1 413 861 | 4/2004 |
| EP | 1 976 034 | 10/2008 |

(Continued)

OTHER PUBLICATIONS

International Search Report issued in PCT/FI2017/050142 dated Jun. 12, 2017.
(Continued)

Primary Examiner — Jayne L Mershon
(74) Attorney, Agent, or Firm — Nixon & Vanderhye P.C.

(57) ABSTRACT

A thermoelectric device (1) comprising a frame (2), a membrane (3) made of thermoelectric material, and an element (4) for absorbing or releasing energy. The element (4) is supported to the frame (2) solely by the membrane (3).

15 Claims, 5 Drawing Sheets

(51) Int. Cl.
    *G01J 5/14*      (2006.01)
    *G01J 5/08*      (2006.01)
    *G01J 5/06*      (2006.01)
    *G01J 5/12*      (2006.01)

(56) References Cited

U.S. PATENT DOCUMENTS

| | | | |
|---|---|---|---|
| 2014/0159032 A1* | 6/2014 | Syllaios | H01L 27/14618 257/43 |
| 2014/0361178 A1 | 12/2014 | Tomioka | |
| 2015/0054114 A1* | 2/2015 | Quad | G01J 5/0225 257/467 |
| 2015/0177069 A1 | 6/2015 | Maes et al. | |

FOREIGN PATENT DOCUMENTS

| | | |
|---|---|---|
| GB | 2521475 | 6/2015 |
| WO | WO 2011/127556 | 10/2011 |
| WO | WO 2013/006151 | 1/2013 |
| WO | WO 2013/155181 | 10/2013 |

OTHER PUBLICATIONS

International Preliminary Report on Patentability issued in PCT/FI2017/050142 dated Sep. 11, 2018.
Search Report issued in FI 20165190 dated Sep. 14, 2016.

\* cited by examiner

THERMOELECTRIC DEVICE

This application is the U.S. national phase of International Application No. PCT/FI2017/050142 filed 3 Mar. 2017, which designated the U.S. and claims priority to FI Patent Application No. 20165190 filed 7 Mar. 2016, the entire contents of each of which are hereby incorporated by reference.

FIELD OF THE INVENTION

The present invention relates to a thermoelectric device.

BACKGROUND OF THE INVENTION

Thermoelectric devices may be used as components of apparatuses wherein a thermoelectric effect is utilized. The thermoelectric effect refers to a direct conversion of temperature differences to electric voltage or vice versa. In thermoelectric effect charge carriers operate as heat carriers.

A prior art thermoelectric device comprises a membrane made of thermoelectric material. The thermoelectric device creates voltage when there is a temperature difference on each side. Conversely, a temperature difference may be created in response to a voltage applied to the thermoelectric device. The thermoelectric devices can thereby be used for example to generate electricity or to change temperature of objects.

BRIEF DESCRIPTION OF THE INVENTION

An object of the present invention is to provide a novel thermoelectric device.

The invention is characterized by the features of the independent claim.

A thermoelectric device comprises a frame, a membrane made of thermoelectric material and an element for absorbing or releasing energy, the element being supported to the frame solely by the membrane.

In the thermoelectric device disclosed the element is supported to the frame solely by the membrane which provides an active element of thermoelectric device. So, there are no additional components or materials which are attached to the element so as to support the element to the frame. This means that electro-thermal performance of the thermoelectric device may be optimized by characteristics of the membrane. Some embodiments of the invention are disclosed in dependent claims.

BRIEF DESCRIPTION OF THE DRAWINGS

In the following the invention will be described in greater detail by means of preferred embodiments with reference to the accompanying drawings, in which.

For the sake of clarity, the figures show some embodiments of the invention in a simplified manner. Like reference numerals identify like elements in the figures.

DETAILED DESCRIPTION OF THE INVENTION

Figure 1:
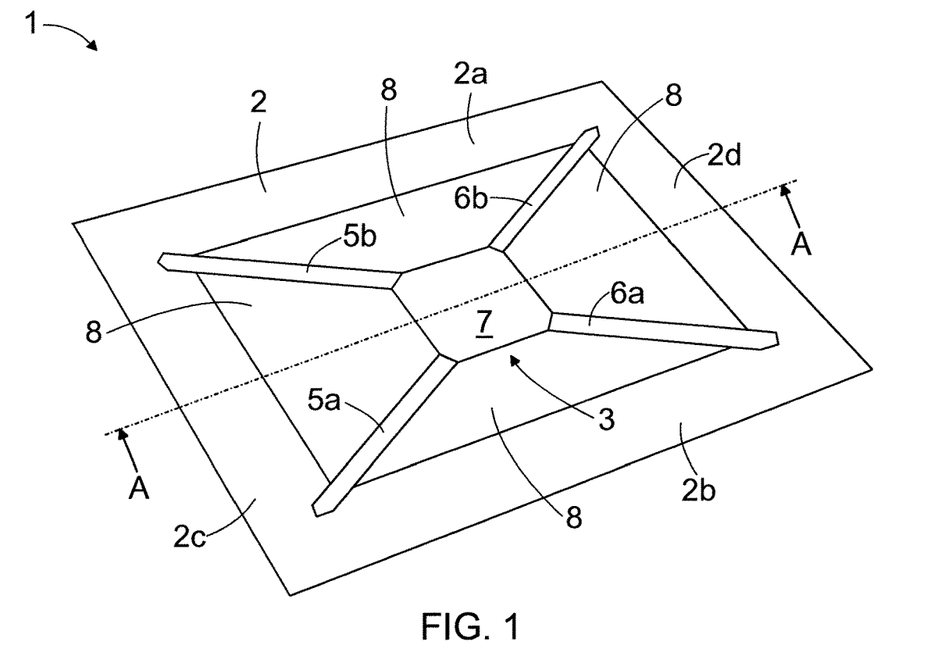
FIG. 1 shows schematically a thermoelectric device obliquely from above.
Figure 2:
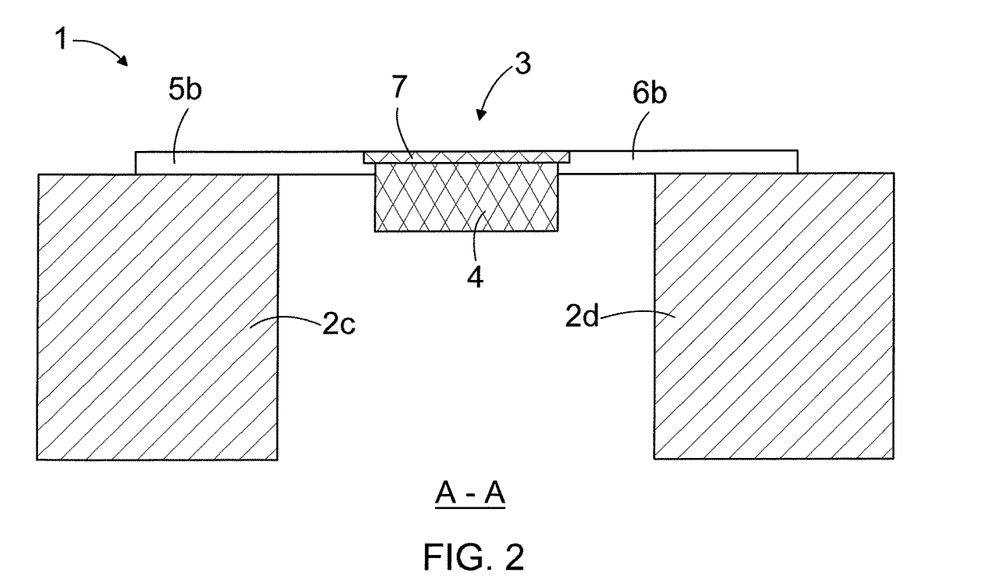
FIG. 2 shows schematically a cross-sectional side view of a thermoelectric device according to FIG. 1.

FIG. 1 shows schematically a thermoelectric device 1 obliquely from above. FIG. 2 shows schematically a cross-sectional side view of a thermoelectric device 1 according to FIG. 1 along a line A-A shown in FIG. 1. Thermoelectric device 1 may be used as a component in an apparatus wherein a thermoelectric effect is utilized.

The thermoelectric device 1 comprises a frame 2 having a first side 2a, a second side 2b, a third side 2c and a fourth side 2d, the number of the sides of the frame 2 varying depending on the actual implementation of the frame 2. Further the thermoelectric device 1 comprises a membrane 3 made of thermoelectric material and attached to the frame 2. The membrane 3 may consist of different materials. Furthermore the thermoelectric device comprises an element 4 for absorbing or releasing energy, i.e. an energy absorber 4 or emitter 4, or in other words, an element 4 capable of absorbing or releasing energy. The element 4 is suspended to the membrane 3 and is supported to the frame 2 solely by the membrane 3.

The membrane 3 of FIG. 1 is patterned to comprise two first beams 5a, 5b and two second beams 6a, 6b and a contacting region 7 for contacting the beams 5a, 5b, 6a, 6b to each other. First ends of the beams 5a, 5b, 6a, 6b are attached to the frame 2 for supporting the membrane 3 to the frame 2 and second ends of the beams 5a, 5b, 6a, 6b are attached to the contacting region 7. The beams 5a, 5b, 6a, 6b and the contacting region 7 may be one uniform membrane structure made of a single membrane billet or the beams 5a, 5b, 6a, 6b and the contacting region 7 may be originally separate parts that are attached to each other so as to form one uniform membrane structure. A number of membrane-free regions 8 remains between the frame 2 and the membrane 3.

According to an embodiment of the thermoelectric device 1 of FIG. 1, the first beams 5a, 5b each are configured to comprise at least one n-type region and the second beams 6a, 6b each are configured to comprise at least one p-type region. The n-type region refers to a region wherein a concentration of conducting electrons is very high or where the Seebeck coefficient is different from that of the p-type region. The p-type region refers to a region wherein a concentration of holes is very high or where the Seebeck coefficient is different from that of the n-type region. Concentration of holes/electrons produced by doping is also referred to with a term p-doped/n-doped. Highly doped n-type and p-type regions may also be denoted with a marking n++ and p++, respectively.

The contacting region 7 is configured to connect the above mentioned regions to each other.

According to an embodiment of the thermoelectric device 1, the contacting region 7 is configured to connect the first beams 5a, 5b and the second beams 6a, 6b to each other pair by pair, but the connection configuration is not limited to this. In this embodiment, for example, the beam 5a may be connected to the beam 6a to contact the at least one n-type region in the beam 5a to the at least one p-type region in the beam 6a, and the beam 5b may be connected to the beam 6b to contact the at least one n-type region in the beam 5b to the at least one p-type region in the beam 6b.

According to an embodiment of the thermoelectric device 1, both the first beams 5a, 5b each and the second beams 6a, 6b each are configured to comprise at least one n-type region, and the contacting region 7 is configured to connect the at least one n-type region remaining in some beam to the at least one n-type region remaining in some another beam.

According to an embodiment of the thermoelectric device 1, both the first beams 5a, 5b each and the second beams 6a, 6b each are configured to comprise at least one p-type region, and the contacting region 7 is configured to connect the at least one p-type region remaining in some beam to the p-type region remaining in some another beam.

According to an embodiment of the thermoelectric device 1, both the first beams 5a, 5b each and the second beams 6a, 6b each are configured to comprise both at least one n-type region and at least one p-type region, and the contacting region 7 is configured to connect the at least one n-type region remaining in some beam to the at least one p-type region remaining either in the same beam or in some another beam.

According to an embodiment of the thermoelectric device 1, the thermoelectric device 1 comprises one first beam and one second beam which are connected to each other by the contacting region. The beams may be arranged to comprise the at least one n-type region and the at least one p-type region in any manner as disclosed above or below.

As a summary of the embodiments mentioned above, it may be said that the membrane is patterned to comprise at least one first beam and at least one second beam, the at least one first beam and the at least one second beam being arranged to support the element to the frame. The at least one first beam is arranged to comprise at least one n-type region and/or at least one p-type region, i.e. at least one of at least one n-type region and at least one p-type region. Furthermore, the at least one second beam is arranged to comprise at least one n-type region and/or at least one p-type region, i.e. at least one of at least one n-type region and at least one p-type region.

In the embodiment of the thermoelectric device 1 disclosed in FIG. 1 the membrane 3 was patterned to comprise altogether four beams, but a number of the beams may vary. In its minimum there may be only one beam which may be configured to comprise at least one n-type region, or at least one p-type region, or both at least one n-type region and at least one p-type region and a possible contacting region 7 for connection the n-type and/or the p-type regions to each other. In its minimum two regions with different thermoelectric properties are needed in order to have finite total voltage.

The at least one n-type region and/or the at least one p-type region may be configured to provide a part or all of the cross-sectional area of the beam 5a, 5b, 6a, 6b, whereby in the latter case it may also be said that the beam 5a, 5b, 6a, 6b is formed of the at least one n-type region and/or the at least one p-type region.

Furthermore, according to an embodiment of the thermoelectric device 1 the membrane 3 does not comprise any beams but the membrane 3 is configured to extent uniformly over a whole free area being confined by sides of the frame, whereby the membrane 3 extends at all its sides uniformly up to the frame 2 so that there are no intentional membrane-free areas 8 in the area confined by the frame. In that case the membrane 3 may also be configured to comprise at least one n-type region, or at least one p-type region, or both at least one n-type region and at least one p-type region and a possible contacting region 7 for connection the n-type and/or the p-type regions to each other.

The frame 2 may for example be a silicon frame. Portions of the membrane 3, such as the beams 5a, 5b, 6a, 6b, comprising the at least one n-type region and/or the at least one p-type region may be formed of for example amorphous, or single crystalline or polycrystalline silicon. The first beams 5a, 5b and the second beams 6a, 6b can be of different materials.

A portion of the membrane 3 comprising the contacting region 7 may be formed of for example metal or semiconductor material or a semimetal or some combination thereof, such as aluminium Al, molybdenum Mo, titanium wolfram TiW, titanium nitride TiN, silicon nitride SiN, doped semiconductor or Graphene. The contacting region may also contain dielectric or nonconductive semiconductor parts, such as SiO2, SiN or weakly or un-doped semiconductors.

According to an embodiment the membrane 3 may be microfabricated from the frame 2.

The element 4 for absorbing or releasing energy may be a metal, or a semiconductor or a semimetal or a dielectric or some combination thereof, such as aluminium Al, molybdenum Mo, titanium wolfram TiW, titanium nitride TiN, silicon nitride SiN, doped or undoped semiconductor, Graphene or porous silicon. The contacting region 7 and the element 4 may be made of same material and region 7 and element 4 may contain holes. Some practical implementations of the element 4 are disclosed later when some practical applications of the thermoelectric device 1 are disclosed.

In the thermoelectric device 1 temperature difference between the central part of the membrane 3 containing the element 4 and the frame 2 creates the electrical signal. Typically the frame 2 is maintained at constant temperature. The temperature difference causes charge carriers in the material to diffuse from a hot side to a cold side.

If the membrane 3 is configured to comprise only at least one n-type region or at least one p-type region, a voltage difference recognizable is yet achievable at least if membrane materials with different thermoelectric properties are applied on the at least one n-type region or the at least one p-type region.

Alternatively, when connecting a power supply to the thermoelectric device 1, temperature difference may be generated between the central part of the membrane 3 containing the element 4 and the frame 2, i.e. between the contacting region 7 and the frame 2. In that case the thermoelectric device 1 may be utilized for heating or cooling purposes, depending on the polarity of the connection between the power supply and the thermoelectric device 1.

The general operating principle of the thermoelectric effect and the thermoelectric devices utilizing the thermoelectric effect is known as such for a person skilled in the art and therefore it is not disclosed herein in more detail.

In the thermoelectric device 1 disclosed the element 4 is supported to the frame 2 solely by the membrane 3, i.e. there are no additional components or materials which are attached to the element 4 so as to support the element 4 to the frame 2. This means that the element 4 is supported to the frame 2 only by the active element, i.e. the membrane 3, of the thermoelectric device 1 so that it is solely the membrane 3 that is attached to the element 4, or in other words, the element 4 is attached solely to the membrane 3 for supporting the element 4 to the frame 2. This means that the electro-thermal performance of the thermoelectric device 1 may be optimized by characteristics of the membrane 3. The patterning of the membrane 3 to comprise beams 5a, 5b, 6a, 6b is one option to effect on the operation characteristics, such as a sensitivity, of the thermoelectric device 1. The number of the beams 5a, 5b, 6a, 6b in the membrane 3 is one feature which effects on a stability of the element 4 in the thermoelectric device 1.

A sensitivity of the thermoelectric device 1, i.e. an ability of the thermoelectric device 1 to convert a temperature difference appearing in the membrane 3 to electric voltage, or to utilize electric voltage applied to the thermoelectric device 1 for heating or cooling purposes, is expressed by thermoelectrical figure-of-merit ZT:

$$ZT=(S^2\sigma/\kappa)T, \quad (1)$$

wherein S is a Seebeck coefficient [V/K] describing a thermoelectric sensitivity of material, σ is electrical conductivity [S] describing material's ability to conduct an electric current, κ is thermal conductivity [W/mK] describing a property of the material to conduct heat and T is the average temperature [K]. For increasing the figure-of-merit ZT of the thermoelectric unit 1 the electrical conductivity σ of the at least one the n-type region and/or the at least one p-type region 6 should be increased and/or the thermal conductivity κ of the at least one the n-type region and/or the at least one p-type region should be decreased. Also the Seebeck coefficient S should be maximized, for example by a proper material selection.

According to an embodiment of the thermoelectric unit 1, the concentration of the electrons, i.e. n++-concentration, in the at least one n-type region, and/or the concentration of the holes, i.e. p++-concentration, in the at least one p-type region, is at least 1E18/cm$^3$, such as 1E18/cm$^3$-5E18/cm$^3$. Preferably the n++-concentration and/or the p++-concentration is at least 1E19/cm$^3$. More preferably the n++-concentration and/or the p++-concentration is at least 1E20/cm$^3$, for example between 1E20/cm$^3$-1E21/cm$^3$.

According to an embodiment of the thermoelectric unit 1, a thickness of the at least one n-type region and/or the at least one p-type region is less than 50 nm. Preferably the thickness of the at least one n-type region and/or the at least one p-type region is less than 40 nm, and more preferably less than 20 nm. When the thickness of the at least one n-type region and/or the at least one p-type region is very small, i.e. few tens of nanometres, the thermal conductivity of the at least one n-type region and/or the at least one p-type region is low due to reduced phonon heat conduction of the membrane 3 at the n-type region and/or the p-type region.

Figure 3:
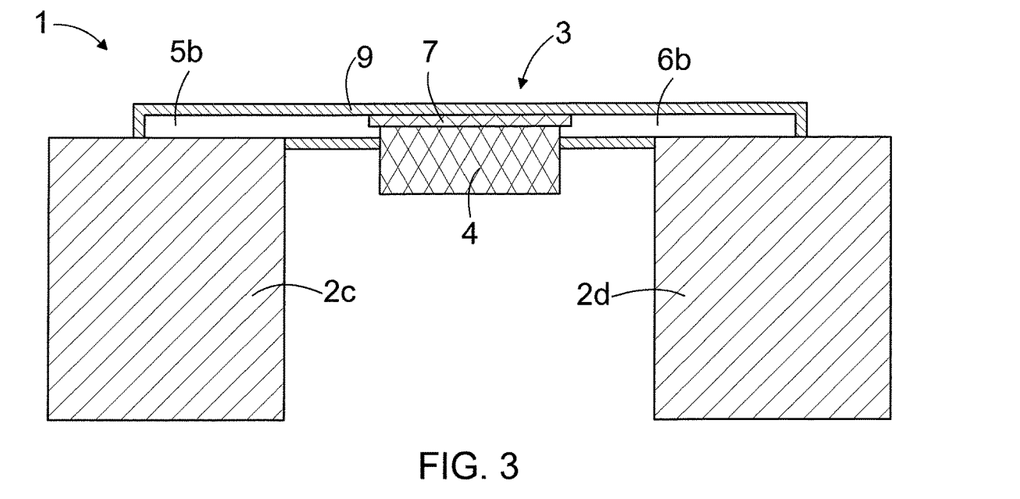
FIG. 3 shows schematically a cross-sectional side view of a second thermoelectric device.

FIG. 3 shows schematically a cross-sectional side view of a second thermoelectric device 1. The thermoelectric device 1 of FIG. 3 is substantially the same as the thermoelectric device 1 of FIG. 2, but in the embodiment of FIG. 3 the membrane 3 is covered by a passivation layer 9. The thickness of the passivation layer is considerably smaller than the thickness of the membrane 3, the only purpose of the passivation layer 9 being to passivate the surface to prevent aging of the thermoelectric material and protect it. The passivation layer 9 may be made of for example silicon dioxide, silicon nitride, aluminium oxide or polymer and it may consist of two or more sublayers laid one on the other so that the sublayers together form the passivation layer 9. If the passivation layer 9 comprise sublayers, some of the sublayers may be of the same material. Passivation layer can be different for different parts of the membrane 3. Native oxides of the membrane 3 materials may provide a sufficient passivation.

Figure 4:
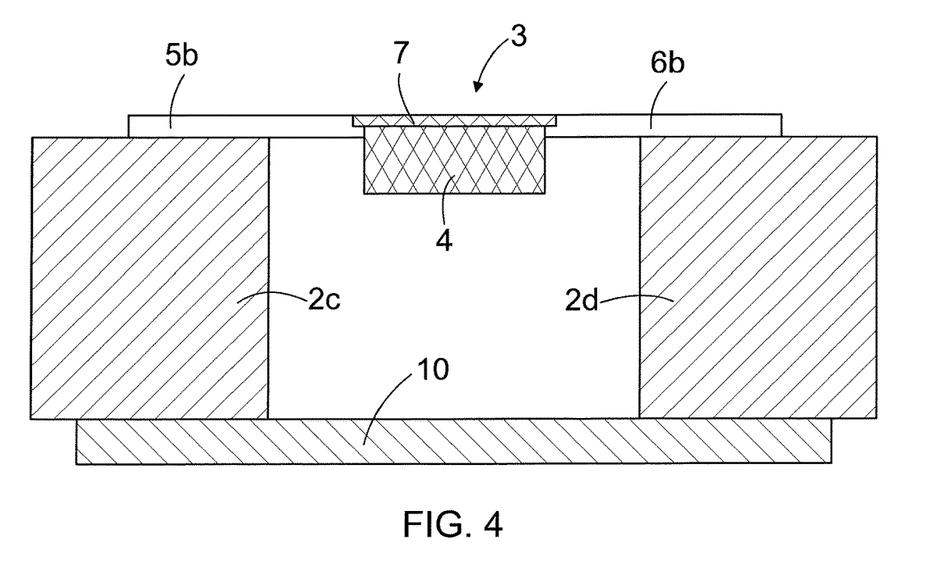
FIG. 4 shows schematically a cross-sectional side view of a third thermoelectric device.

FIG. 4 shows schematically a cross-sectional side view of a third thermoelectric device 1. The thermoelectric device 1 of FIG. 4 is otherwise similar to that of FIG. 2 but the thermoelectric device 1 of FIG. 4 further comprises a full back reflector 10 below the element 4.

The full back reflector 10 is arranged to extend up to all sides 2a, 2b, 2c, 2d of the frame 2 so that there are no intentional open areas between the full back reflector 10 and the sides 2a, 2b, 2c, 2d of the frame 2. The full back reflector 10 may be replaced with a partial back reflector, whereby there may be some open areas between the full back reflector 10 and the sides 2a, 2b, 2c, 2d of the frame 2. The purpose of the full back reflector 10 and the partial back reflector arranged below the element 4 is to reflect radiation passed through the membrane 3 back towards the element 4.

Alternatively to the full or partial back reflector or in addition to them the thermoelectric device 1 may also comprise a partial front reflector 11 above the element 4 as also shown in FIG. 4, the partial front reflector 11 leaving open areas between the reflector 11 and the frame 2. The purpose of the front reflector 11 is to reflect radiation towards the membrane 3 and the element 4 suspended to the membrane 3.

The distance of the back reflector 10 and/or the front reflector 11 is optimized at a preferred distance from the element 4. Typically the distance of the back and/or front reflector from the element is set to be about a quarter of a wavelength of the radiation intended to be absorbed by the thermoelectric device 1, or a multiple of the quarter of the wavelength of the radiation.

Figure 5:
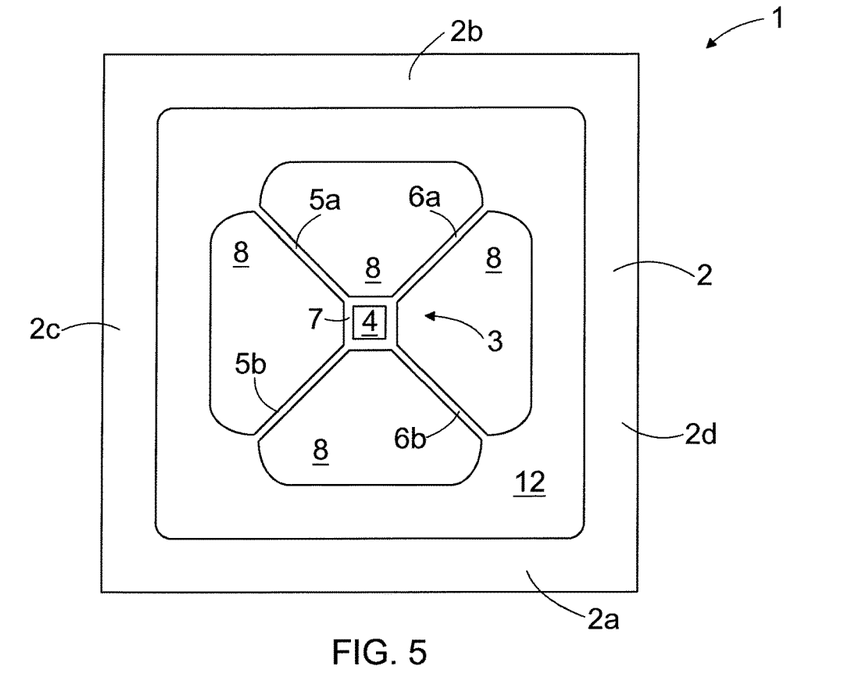
FIG. 5 shows schematically a fourth thermoelectric device from below.

FIG. 5 shows schematically a fourth thermoelectric device 1 from below. The thermoelectric device 1 of FIG. 5 comprises a frame 2 and a membrane 3 made of thermoelectric material. The membrane 3 comprises beams 5a, 5b, 6a, 6b and a connecting region 7 as well as an element 4 suspended to the membrane 3. The membrane-free areas are again denoted with the reference number 8. In the thermoelectric device 1 of FIG. 5 the portion 12 of the membrane 3 denotes an unpatterned part of the membrane 3 that extends from the beams 5a, 5b, 6a, 6b up to the sides 2a, 2b, 2c, 2d of the frame 2. The membrane 3, the element 4 and the contacting region 7 may be made of material that has mechanical properties which cause the material to contract or to strain for keeping the membrane 3, the element 4 and the contacting region 7 straight.

Figure 6:
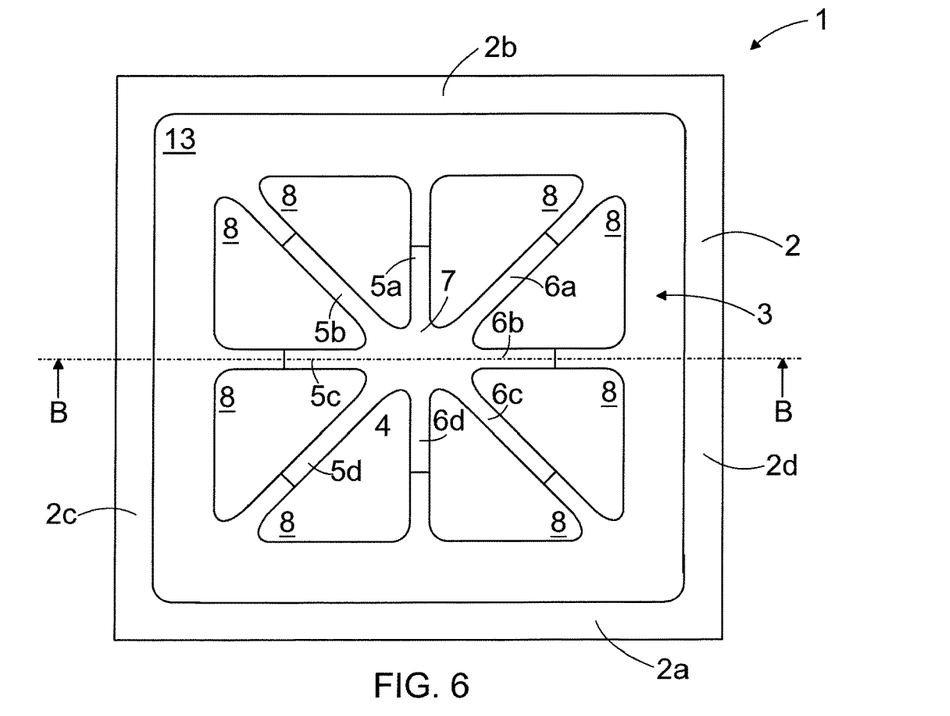
FIG. 6 shows schematically a top view of a fifth thermoelectric device from below.
Figure 7:
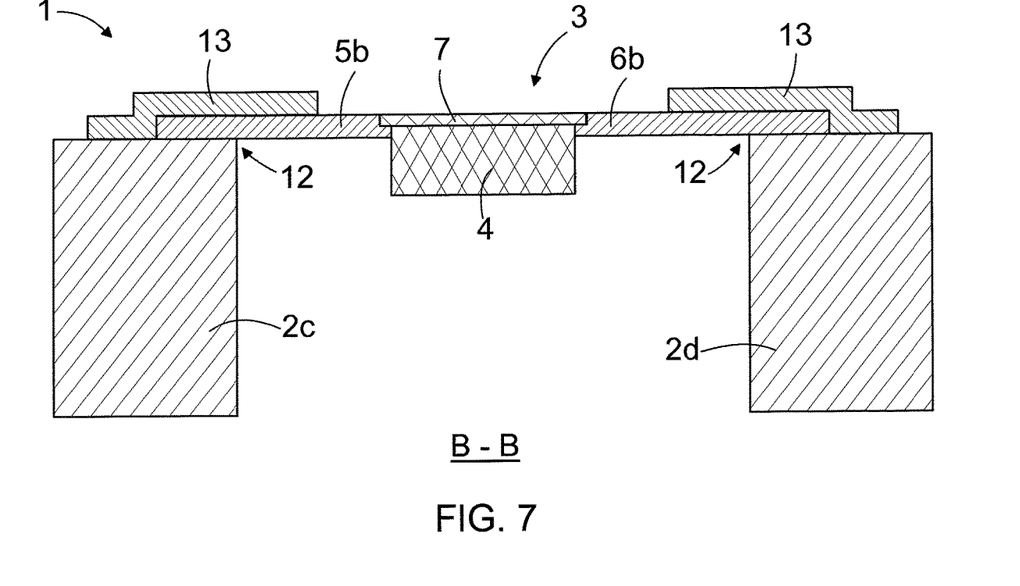
FIG. 7 shows schematically a cross-sectional side view of the thermoelectric device of FIG. 6.

FIG. 6 shows schematically a top view of a fifth thermoelectric device 1 from below. FIG. 7 shows schematically a cross-sectional side view of the thermoelectric device of FIG. 6 along a line B-B shown in FIG. 6.

The thermoelectric device 1 of FIGS. 6 and 7 comprises a frame 2 and a membrane 3 made of thermoelectric material. The membrane 3 comprises beams 5a, 5b, 5c, 5d 6a, 6b, 6c, 6d and a connecting region 7 as well as an element 4 suspended to the membrane 3. The membrane 3 further comprises the unpatterned part 12 of the membrane 3 to which first ends of the beams 5a, 5b, 5c, 5d 6a, 6b, 6c, 6d of the membrane 3 are attached to, the first ends of the beams 5a, 5b, 5c, 5d, 6a, 6b, 6c, 6d being the ends of the beams pointing towards the sides 2a, 2b, 2c, 2d of the frame 2. The membrane-free areas are again denoted with the reference number 8.

The thermoelectric device 1 of FIGS. 6 and 7 also comprises a strain tuning layer 13 that has the circumferential shape and remains between the membrane 3 and the frame 2 surrounding the membrane 3. The strain tuning layer 13 provides an element which suspends the membrane 3 to the frame 2 so that the membrane and/or beams are retained straight or flat by pulling the membrane and/or the beams. The strain tuning layer 13 may be made of silicon nitride, for example, whereby the strain tuning layer 13 is thermodynamically stable and able to retain the membrane/beams straight in varying temperatures. An outer circumference of the unpatterned portion 12 of the membrane 3 is attached to the frame 2 and to the strain tuning layer 13. An outer circumference of the strain tuning layer 13 is attached to the sides 2a, 2b, 2c, 2d of the frame 2. The strain tuning layer 13 may also extend partially on top of the beams, but still not reaching up to the element 4, as schematically shown in FIGS. 6 and 7.

In the embodiment of FIG. 6 the strain tuning layer 13 provides a strain control element which suspends the membrane 3 to the frame 2 so that the membrane and/or beams are retained straight. In spite of the usage of the strain tuning layer 13, the element 4 is supported to the frame 2 solely by the membrane 3, i.e. only the membrane 3 and not any additional component or material is attached to the element 4 for supporting the element 4 to the frame 2.

Figure 8:
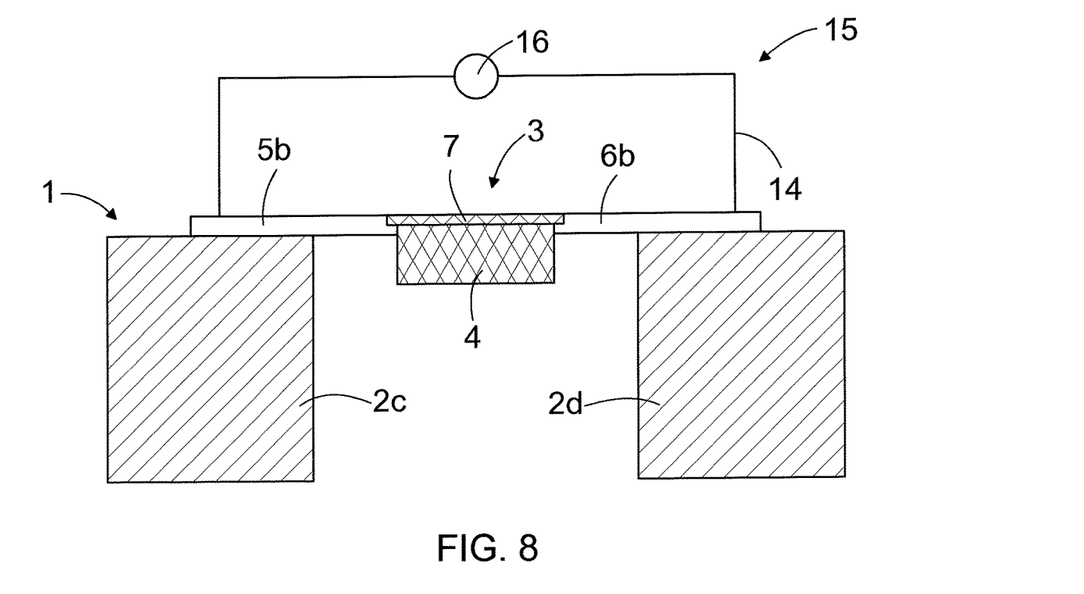
FIG. 8 shows schematically an example of a radiation meter.
Figure 9:
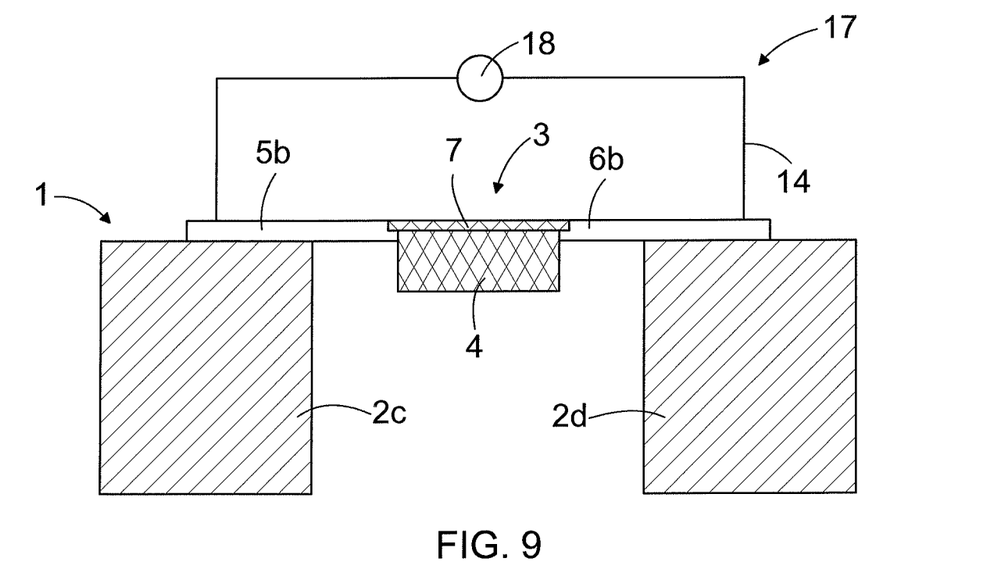
FIG. 9 shows schematically an example of a thermoelectric cooling structure.
Figure 10:
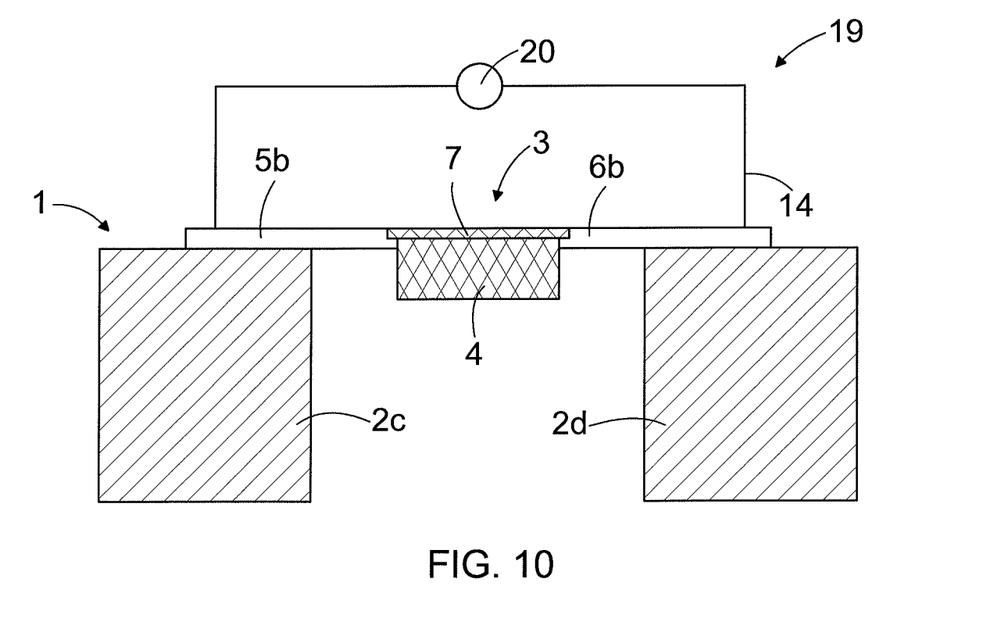
FIG. 10 shows schematically an example of an energy harvester.

FIGS. 8, 9 and 10 disclose schematically some examples of apparatuses wherein the thermoelectric devices 1 as disclosed may be used. This kind of apparatuses may comprise one or more thermoelectric devices, the following example apparatuses showing, for a sake of clarity, only one thermoelectric device 1. In the apparatuses the n-type regions and the p-type regions are connected through at least one electric circuit 14 that is external to the thermoelectric device 1. Typically the thermoelectric device 1 comprises a number of poles to which the ends of the electric circuit 14 are connected to, but in the schematic Figures the ends of the electric circuit 14 are connected to the n-type and p-type regions.

FIG. 8 shows schematically an example of a radiation meter 15. In the radiation meter 15 the element 4 is an absorber for absorbing radiation. The absorber may be made of for example black silicon or black metal, such as black oxide coated metal, or a thin metallic multilayer grid, or a combination thereof or an optically matched multilayer or any other surface structure that enhances the absorption of the desired wavelength or range of wavelengths.

The radiation meter is configured to measure energy and/or power of radiation received by the absorber on the basis of change in electric current in the electric circuit 14 or a voltage difference formed between the central part of the membrane and the frame. The radiation meter 15 may comprise a meter 16 for measuring either electric current in the electric circuit 14 or the voltage difference between the central part of the membrane and the frame.

The radiation meter may be a bolometer, a calorimeter or the like for example. The frequency range of the electromagnetic radiation may range from gigaherzes to hundreds of teraherzes without restricting to this range. Applications may be found in the fields of detection of infrared, X-ray, visible light, THz-range or the like radiation.

A sensitivity of the radiation meter is described by noise equivalent power NEP. For a thermoelectric device below the thermal cut-off $$NEP=NEPG\,(1+1/ZT)^{1/2}, \qquad (2)$$

wherein $$NEPG=(4k_BGT^2)^{1/2}, \qquad (3)$$

wherein $k_B$ is Bolzmann constant [J/K] and G is a thermal conductance [W/mK] of the n-type and/or p-type regions. The thermal conductance G for the n-type and/or p-type regions is dependent on the cross-sectional area of the n-type and/or p-type regions as well as length thereof. In order to maximize the sensitivity of the radiation meter the noise equivalent power NEP should be minimized.

In order to minimize the noise equivalent power NEP of the radiation meter the value of ZT should be maximized. Therefore the electrical conductivity σ of the n-type and/or p-type regions should be maximized. This may be implemented by providing a concentration of electrons and/or holes as disclosed above. Also the Seebeck coefficient S should be maximized, as disclosed above in connection with formula (1).

Furthermore, in order to minimize the noise equivalent power NEP of the radiation meter NEPG should be minimized by minimizing G. The smaller is the value of G, the smaller is the thermal cut-off, and, therefore, the value of G typically must be optimized for each application case. ZT is maximized and G is minimized by minimizing the thermal conductivity κ of the n-type and/or p-type regions. In order to minimize the thermal conductivity of the n-type and/or p-type regions, that may be implemented by minimizing the phonon thermal conductivity of the n-type and/or p-type regions by minimizing a thickness of the n-type and/or p-type regions as disclosed above.

FIG. 9 shows schematically an example of a thermoelectric cooling structure 17 comprising at least one thermoelectric device 1. In the thermoelectric cooling structure 17 the element 4 is at least part of a device to be cooled or a part connected to a device to be cooled. Cooled device may have electrical and/or optical connections to the frame or to other thermal path.

In the thermoelectric cooling structure 17 a voltage source 18 is connected through the electric circuit 14 to the at least one thermoelectric device 1 so as to provide Peltier effect to take place. In a junction between the membrane 3 and the element 4 heat is transferred away from the element 4, which is intended to become hot due to heat received from the device to be cooled and/or from the surroundings and the ambient. The heat received to the membrane 3 from the element 4 may be transferred out of the thermoelectric device 1 with a heat sink, for example.

FIG. 10 shows schematically an example of an energy harvester 19. In the energy harvester 19 the element 4 is a hot or cold element configured to absorb or release thermal energy. According to an embodiment the at least one thermoelectric unit 1 is connected through the electric circuit 14 to an electric energy storage component 20 intended to provide at least a short-term storage for electric energy. Some possible practical embodiments of the electric energy storage components 20 are for example a supercapacitor or a rechargeable battery.

It will be obvious to a person skilled in the art that, as the technology advances, the inventive concept can be implemented in various ways. The invention and its embodiments are not limited to the examples described above but may vary within the scope of the claims.

The invention claimed is:
1. A thermoelectric device comprising
   a frame,
   a membrane made of thermoelectric material and providing an active element of the thermoelectric device, and
   an absorbing element for absorbing or releasing energy, the absorbing element being supported to the frame solely by the membrane.

2. A thermoelectric device as claimed in claim 1, wherein the membrane comprises at least one n-type region and/or at least one p-type region.

3. A thermoelectric device as claimed in claim 2, wherein the at least one n-type region and/or the at least one p-type region are formed of amorphous, single crystalline or polycrystalline silicon.

4. A thermoelectric device as claimed in claim 3, wherein a concentration of electrons or holes is at least $1E18/cm^3$.

5. A thermoelectric device as claimed in claim 2, wherein thickness of the n-type region and/or the p-type region is less than 50 nm, preferably less than 40 nm, more preferably less than 20 nm.

6. A thermoelectric device as claimed in claim 1, wherein the membrane comprises at least one n-type region, at least one p-type region and at least one contacting region for contacting at least one region with at least one another region.

7. A thermoelectric device as claimed in claim 1, wherein the membrane is patterned to comprise at least one first beam and at least one second beam, the at least one first beam comprising at least one n-type region and/or at least one p-type region, and the at least one second beam comprising at least one n-type region and/or at least one p-type region, the at least one first beam and the at least one second beam arranged to support the absorbing element to the frame.

8. A thermoelectric device as claimed in claim 1, wherein the thermoelectric device comprises at least one strain tuning layer for retaining the membrane and/or beams straight or flat.

9. A thermoelectric device as claimed in claim 1, wherein the absorbing element for absorbing or releasing energy is a metal, a semiconductor or a dielectric, or a combination of those.

10. A thermoelectric device as claimed in claim 1, wherein the membrane is covered by a passivation layer.

11. A thermoelectric device as claimed in claim 1, wherein the thermoelectric device comprises a full or partial back reflector arranged below the absorbing element to reflect radiation passed through the membrane back towards the element.

12. A thermoelectric device as claimed in claim 11, wherein the thermoelectric device comprises a partial front reflector.

13. A radiation meter, wherein the radiation meter comprises at least one thermoelectric device as claimed in claim 1, wherein the absorbing element is an absorber for absorbing radiation, the radiation meter being configured to measure energy and/or power of radiation received by the absorber.

14. A thermoelectric cooling structure, wherein the thermoelectric cooling structure comprises at least one thermoelectric device as claimed in claim 1, wherein the absorbing element is at least part of a device to be cooled or a part connected to a device to be cooled.

15. An energy harvester, wherein the energy harvester comprises at least one thermoelectric device as claimed in claim 1, wherein the absorbing element is a hot or cold element configured to absorb or release thermal energy.

* * * * *